United States Patent [19]
Krautschneider et al.

[11] Patent Number: 5,710,448
[45] Date of Patent: Jan. 20, 1998

[54] INTEGRATED POLYSILICON DIODE CONTACT FOR GAIN MEMORY CELLS

[75] Inventors: Wolfgang H. Krautschneider, Hohenthann; Doris Schmitt-Landsiedel, Ottobrunn; Werner Klingenstein, Kirchheim, all of Germany

[73] Assignee: Siemens Aktiengesellschaft, Munich, Germany

[21] Appl. No.: 549,885

[22] Filed: Oct. 27, 1995

[51] Int. Cl.⁶ .................................................. H01L 29/76
[52] U.S. Cl. ............................ 257/288; 257/367; 257/377
[58] Field of Search ................................ 257/577, 588, 257/288, 326, 350, 307, 377

[56] References Cited

U.S. PATENT DOCUMENTS

| | | | |
|---|---|---|---|
| 4,396,999 | 8/1983 | Malayira | 355/159 |
| 4,516,233 | 5/1985 | Erickson | 256/288 |
| 4,616,404 | 10/1986 | Wang et al. | 257/577 |
| 4,864,374 | 9/1989 | Banerjee | 357/23 |
| 4,970,689 | 11/1990 | Kenney | 365/189 |
| 4,999,811 | 3/1991 | Banerjee | 365/149 |
| 5,021,849 | 6/1991 | Pflester et al. | 357/23 |
| 5,032,891 | 7/1991 | Takagi et al. | 357/41 |

FOREIGN PATENT DOCUMENTS

| | | |
|---|---|---|
| P44175 | 5/1994 | Germany. |
| 9201287 | 1/1992 | WIPO. |

OTHER PUBLICATIONS

Edward Hackbarth and Denny Duna–Lee Tang, Inherent and Stress–Induced Leakage in Heavily Doped Silicon Junction, Dec., 1988, IEE Transactions on Electron Devices, vol. 35, No. 12, Dec. 1988.

W.H. Krautschneider, et al, Fully Scalable Gain Memory Cell for Future Drams, 1991, Microelectronic Engineering, vol. 15, 1991.

*Primary Examiner*—Wael Fahmy
*Assistant Examiner*—Roy Potter
*Attorney, Agent, or Firm*—Donald B. Paschburg

[57] ABSTRACT

An integrated polysilicon diode contact having multiple doped layers. A first highly doped layer of a first dopant type is deposited on a silicon substrate. A second highly doped layer of a second, different dopant type is deposited on the substrate, separated by a spacer from the first highly doped layer. A third lower doped layer of the second dopant type is deposited on the first highly doped layer and second highly doped layers, the third lower doped layer forming a p-n junction with a source region having a dopant of the first type.

20 Claims, 1 Drawing Sheet

5,710,448

INTEGRATED POLYSILICON DIODE CONTACT FOR GAIN MEMORY CELLS

BACKGROUND OF THE INVENTION

1. Field of the Invention

The present invention generally relates to dynamic gain memory cells, and, more particularly, to an integrated polysilicon diode contact with a reverse current that is adjustable and does not vary significantly within the normal operating temperature of the memory cell.

2. Description of the Prior Art

Semiconductor diodes are fundamental components in digital integrated circuits. Two basic forms of semiconductor diodes are widely used: the p-n junction diode and the Schottky-barrier diode.

The p-n junction diode consists of a semiconductor having a p-type region and an n-type region separated by a region of transition. The p region has holes as the dominant or majority carrier while in the n region electrons are the majority carriers.

In a reverse bias situation, the applied voltage makes the p region negative with respect to the n region. The majority carriers are then drawn away from both sides of the junction, creating a depletion layer. The charge carriers that flow across the junction are the minority carriers, that is, electrons from the p region and holes from the n region. Since the minority carrier concentrations in the respective regions are orders of magnitude lower than the majority carrier concentrations, this reverse "leakage" current flow under reverse bias is also orders of magnitude lower than the current that flows under forward bias.

In the forward bias situation, the applied voltage makes the p region positive with respect to the n region. Holes cross the junction from the p region to the n region while electrons cross the junction from the n region to the p region.

Schottky barrier diodes can be made by forming a microscopically clean contact between certain metals and a lightly doped n-type semiconductor ($N_D < 1 \times 10^{16}$ cm$^{-3}$). The characteristic potential between the two materials is termed the Schottky barrier. The principal advantage of Schottky diodes is that all conduction is via electrons flowing in metal or n-type silicon. That is, only majority carriers contribute to current flow, hence there are no minority carrier storage effects.

Not all metal-semiconductor contacts have diode characteristics. When the semiconductor is heavily doped ($N_A$ or $N_D > 1 \times 10^{17}$ cm$^{-3}$) the depletion layer becomes so narrow that carriers can travel in either direction through the potential barrier by a quantum-mechanical carrier transport mechanism know as tunneling. Under these conditions, current flows equally well in either direction, resulting in what is described as ohmic contact.

The general temperature effects on a semiconductor diode are described in David A. Hodges & Horace G. Jackson, *Analysis and Design of Digital Integrated Circuits*, pp. 113–155, 2nd Ed. 1988. In particular, the ideal diode equation, namely, $$I = I_s (e^{\frac{V}{V_T}} - 1)$$

relates the diode current to the diode voltage. $I_s$ is a constant, referred to as the saturation current of the diode. The thermal voltage $V_T$ is equal to kT/q, which is approximately 0.026 volts at a room temperature of 27° C. 'T' is the room temperature (300° K or 27° C.), 'q' is the electron charge, and 'k' is Boltzmann's constant.

The ideal diode equation is affected by temperature in two ways:

(1) The saturation current $I_s$ is a function of $n_i^2$ (intrinsic carrier concentration), which increases strongly with temperature; and (2) The thermal voltage $V_T$ that appears in the exponent is linearly dependent on temperature.

Experimentally, the saturation current approximately doubles every 5° C.; the reverse current doubles about every 8° C.; and the forward current doubles about every 12° C. The effect of temperature on $I_s$ is therefore mainly the result of the temperature dependence of the square of the intrinsic carrier concentration.

In light of the foregoing, a need exists for integrated diode contact with a low temperature sensitivity or temperature dependence.

SUMMARY OF THE INVENTION

The present invention is directed to an integrated polysilicon diode structure, which substantially obviates one or more of the problems due to the limitations and disadvantages of the related art.

In general, dynamic gain memory cells require a diode contact with two features. One is that the reverse current must not vary significantly within the specified temperature range of normal operation. Second, the reverse current has to be adjustable for optimum performance of the memory cell.

The first feature is realized by a diode contact with a reverse current flow based on tunneling processes. Such a diode contact may be produced by a p-n junction consisting of two layers; a highly doped polysilicon and a relatively lower doped silicon or polysilicon layer, respectively, of opposite dopant type.

The second feature is enabled by choosing an appropriate dopant concentration for the relatively lower doped polysilicon layer so that the reverse current flow can be adjusted for optimum cell performance.

The diode structure of the present invention can be used in connection with dynamic gain memory cells as described in German Patent Application No. P44 17150.1 to Dr. Wolfgang Krautschneider et al., filed May 17, 1994 (Docket No. 93 E 1875 DE), the contents of which are hereby incorporated by reference. The diode structure is so dimensioned that at the effective gate electrode a relatively high current flow occurs when charging and a relatively low current flow when discharging.

To achieve these and other advantages and in accordance with the purpose of the invention embodied and broadly described herein, there is provided an integrated polysilicon diode contact, comprising: a gate oxide layer deposited on a silicon substrate; a first highly doped layer having a dopant of a first type deposited on the gate oxide layer; a second highly doped layer having a dopant of a second different type deposited on the substrate, the second highly doped layer being spaced from the gate oxide and first highly doped layers; and a third lower doped layer having a dopant of the second type deposited on the first highly doped layer and second highly doped layer, the third lower doped layer forming a p-n junction with a source region having a dopant of the first type.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF AN EMBODIMENT OF THE INVENTION

In a gain memory cell, a diode contact allows a high current flow during charging of the storage capacitance and a well defined low current flow in the reverse direction when the cell is discharged during the read-out operation of the gain memory cell, so that a high amount of signal charge can be provided and the cell can be erased within a very short time.

The reverse current flow, which is very critical for the cell's operation, has to be constant within the specified temperature range of normal operation. Therefore, the reverse current transport has to be based on a physical mechanism, which shows only little temperature dependence, such as a p-n junction.

Figure 1:
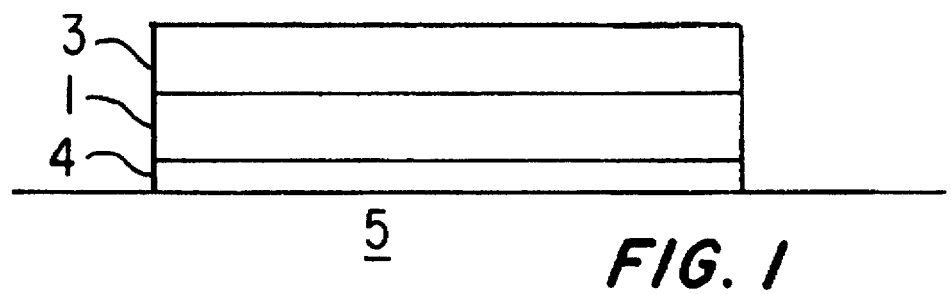
FIG. 1 is side cross-section of a p-n junction.

Referring now to the drawings and more particularly to FIG. 1, there is provided a polysilicon p-n junction consisting of a highly doped polysilicon layer 1 deposited on a gate oxide layer 4 on silicon substrate 5. The highly doped layer 1 is covered by a lower doped polysilicon layer 3 of opposite dopant type.

The band structure of the polysilicon p-n junction provides states within the bandgap. These states support a so-called trap-assisted tunneling current. The reverse current of this type of junction flows predominately as a tunneling current, thus varying only slightly within the temperature range of normal operation conditions. See E. Hackbarth and D. D. Tang, "Inherent and Stress-Induced Leakage in Heavily Doped Silicon Junctions", *IEEE Trans. Electron Dev.*, Vol. ED-35, p. 2108, 1988.

The reverse current of the diode contact for a gain memory cell has to be adjusted for an optimum function of the gain memory cell in respect of signal output and access time. Referring to FIG. 1, an adjustable p-n junction can be realized by a highly doped silicon or polysilicon layer 1 contacting a silicon or polysilicon layer 3 of opposite dopant type with a dopant concentration which can be independently controlled. By choosing different doping concentrations, the reverse current can be varied in a wide range, so that the properties of the gain cell can easily be optimized. When these types of p-n junctions are biased in the forward direction, they provide the high current flow which is necessary for efficient operation of a gain memory cell.

For integration into a gain memory cell this diode contact has to be connected to the source region of the storage transistor. For achieving this, a low ohmic resistance is required between the polysilicon layer and the source region, which can be of opposite dopant type.

Figure 2:
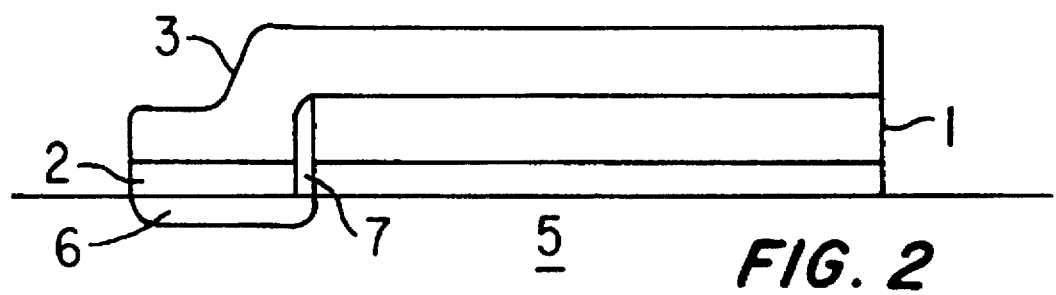
FIG. 2 is a side cross-section of the p-n junction of FIG. 1 connected to the source region of the storage transistor.

With reference to FIG. 2, this can be realized by strapping the polysilicon layer 3 to the source region 6 and by placing between the layer 3 and the source region 6 an additional very highly doped layer 2 of the same dopant type as the polysilicon layer 3.

The structure of FIG. 2 will now be described in greater detail. The silicon substrate 5 is, for example, p-doped with a concentration of $1\times10^{16}$ $cm^{-3}$. A conventional thin gate oxide layer 4 is grown on the silicon substrate 5. A first silicon or polysilicon layer 1 is then deposited on the gate oxide layer 4 to a thickness of about 300 nm. The first silicon or polysilicon layer 1 is a highly $n^+$ doped layer, with a dopant concentration of $5\times10^{19}$ $cm^{-3}$. The dopant may be, for example, arsenic or phosphorus. By conventional photolithography and spacer techniques, a mask is defined and second silicon or polysilicon layer 2 is then deposited with a thickness of about 100 nm. It is spaced from the first layer 1 and gate oxide layer 4 by a spacer 7. It is doped in-situ or by shallow ion implantation with a dopant concentration of about $1\times10^{20}$ $cm^{-3}$.

After this, a third silicon or polysilicon layer 3 is deposited. It is moderately doped in-situ or by shallow ion implantation with a dopant concentration of about $5\times10^{17}$ $cm^{-3}$. The dopant for the third layer 3 is the same as that of the second layer 2, and may be, for example, boron. Prior to deposition of the third polysilicon layer 3, a very thin oxide layer or polycide layer with a thickness of about 1–2 nm can be deposited on the surface of the first and second polysilicon layers 1 and 2 in order to suppress outdiffusion of the dopants from the third polysilicon layer 3 into the first polysilicon layer 1 and vice versa.

The p-n junction, formed by the source region 6 and the polysilicon strap 3, becomes a tunnel contact with a current voltage behavior that is not dependent on the direction of the applied voltage. This tunneling contact becomes most effective when the dopant concentration in the junction region is extremely high. The source region 6 has a dopant concentration of about $5\times10^{20}$ $cm^{-3}$. The dopant may be, for example, arsenic or phosphorus.

While the invention has been described in terms of the above embodiments, those skilled in the art will recognize that the invention can be practiced with modification within the spirit and scope of the appended claims.

Having thus described my invention, what we claim as new and desire to secure by Letters Patent is as follows:

1. An integrated polysilicon diode contact, comprising:
   a gate oxide layer deposited on a silicon substrate;
   a first highly doped layer having a dopant of a first type deposited on said gate oxide layer;
   a source region formed in a surface of said silicon substrate, wherein said source region has a dopant of the first type;
   a second highly doped layer having a dopant of a second different type deposited on said source region, said second highly doped layer being spaced from said gate oxide layer and said first highly doped layer; and
   a third lower doped layer having a dopant of the second type deposited on and interconnecting said first highly doped layer and said second highly doped layer, said third lower doped layer forming a p-n junction with said source region.

2. A diode contact as in claim 1, wherein said first highly doped layer is one of silicon and polysilicon.

3. A diode contact as in claim 2, wherein said first highly doped layer has a dopant concentration of about $5\times10^{19}$ $cm^{-3}$.

4. A diode contact as in claim 3, wherein said dopant of the first type is arsenic or phosphorus.

5. A diode contact as in claim 4, wherein said second highly doped layer is one of silicon and polysilicon.

6. A diode contact as in claim 5, wherein said second highly doped layer has a dopant concentration of about $1\times10^{20}$ $cm^{-3}$.

7. A diode contact as in claim 6, wherein said dopant of the second type is boron.

8. A diode contact as in claim 7, wherein said source region has a dopant concentration of about $5\times10^{20}$ cm$^{-3}$.

9. A diode contact as in claim 8, wherein said third lower doped layer is one of silicon and polysilicon.

10. A diode contact as in claim 9, wherein said third lower doped layer has a dopant concentration of about $5\times10^{20}$ cm$^{-3}$.

11. A diode contact as in claim 6, wherein said second highly doped layer has a thickness of about 100 nm.

12. A diode contact as in claim 1, wherein said silicon substrate has a dopant of the second type.

13. A diode contact as in claim 12, wherein said silicon substrate has a dopant concentration of $1\times10^{16}$ cm$^{-3}$.

14. An integrated polysilicon diode contact, comprising:

a gate oxide layer deposited on a silicon substrate, said silicon substrate having a p-type dopant;

a first highly doped layer having an n-type dopant deposited on said gate oxide layer;

a source region formed in a surface of said silicon substrate, wherein said source region has an n-type dopant;

a second highly doped layer having a p-type dopant deposited on said source region, said second highly doped layer being spaced from said gate oxide layer and said first highly doped layer; and a third lower doped layer having a p-type dopant deposited on and interconnecting said first highly doped layer and said second highly doped layer, said third lower doped layer forming a p-n junction with said source region.

15. An integrated polysilicon diode contact, comprising:

a gate oxide layer deposited on a silicon substrate;

a first highly doped layer having a dopant of a first type deposited on said gate oxide layer;

a source region formed in a surface of said silicon substrate, wherein said source region has a dopant of the first type;

a second highly doped layer having a dopant of a second different type deposited on said source region, said second highly doped layer being spaced from said gate oxide layer and said first highly doped layer;

a dopant diffusion suppression layer deposited on said first highly doped layer and said second highly doped layer, said dopant diffusion suppression layer having a thickness of about 1-2 nm and being selected form the group consisting of an oxide layer and a polycide layer; and a third lower doped layer having a dopant of the second type deposited on said dopant diffusion suppression layer, said third lower doped layer interconnecting the first highly doped layer and said second highly doped layer, and said third lower doped layer forming a p-n junction with said source region.

16. A diode contact as in claim 15, wherein said dopant of said first type is an n-type dopant, and said dopant of said second type is a p-type dopant.

17. A diode contact as in claim 16, wherein said p-type dopant is selected from arsenic or phosphorus, and said n-type dopant is boron.

18. A diode contact as in claim 15, wherein said first highly doped layer is one of silicon and polysilicon.

19. A diode contact as in claim 15, wherein said second highly doped layer is one of silicon and polysilicon.

20. A diode contact as in claim 15, wherein said third lower doped layer is one of silicon and polysilicon.

* * * * *